US 6,586,843 B2

(12) United States Patent
Sterrett et al.

(10) Patent No.: US 6,586,843 B2
(45) Date of Patent: Jul. 1, 2003

(54) INTEGRATED CIRCUIT DEVICE WITH COVALENTLY BONDED CONNECTION STRUCTURE

(75) Inventors: Terry Sterrett, Cave Creek, AZ (US); Tim Chen, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/986,409

(22) Filed: Nov. 8, 2001

(65) Prior Publication Data

US 2003/0087475 A1 May 8, 2003

(51) Int. Cl.[7] .................. H01L 23/48; H05K 1/09; H05K 1/16
(52) U.S. Cl. ............... 257/778; 257/734; 257/737; 174/257; 174/260
(58) Field of Search ................ 257/678, 734, 257/737, 738, 778; 174/257, 260

(56) References Cited

U.S. PATENT DOCUMENTS

| 5,034,801 | A | * | 7/1991 | Fischer | 357/72 |
|---|---|---|---|---|---|
| 5,237,130 | A | * | 8/1993 | Kulesza et al. | 174/260 |
| 5,442,240 | A | * | 8/1995 | Mukerji | 257/783 |
| 5,611,140 | A | | 3/1997 | Kulesza et al. | |
| 6,109,175 | A | * | 8/2000 | Kinoshita | 101/170 |
| 6,138,348 | A | | 10/2000 | Kulesza et al. | |
| 6,189,208 | B1 | | 2/2001 | Estes et al. | |
| 6,219,911 | B1 | | 4/2001 | Estes et al. | |
| 6,320,250 | B1 | * | 11/2001 | Takahashi | 257/678 |
| 6,346,296 | B1 | * | 2/2002 | McCarthy et al. | 427/384.5 |
| 6,406,795 | B1 | * | 6/2002 | Hwang et al. | 428/457 |

* cited by examiner

Primary Examiner—Kamand Cuneo
Assistant Examiner—Scott B Geyer
(74) Attorney, Agent, or Firm—Kenyon & Kenyon (57) ABSTRACT

A method and apparatus provides increased operative life for flip-chip devices that are produced from an integrated circuit formed with electrically conductive bumps bonded to a printed circuit board substrate. The bumps and the substrate are formed from similar materials that allow control of the degree of latency for each element and produce a covalently bonded laminate structure when the bumps and substrate are brought together. The covalently bonded structure decreases bump fatigue to lengthen the operative life of the flip-chip device.

19 Claims, 13 Drawing Sheets

INTEGRATED CIRCUIT DEVICE WITH COVALENTLY BONDED CONNECTION STRUCTURE

BACKGROUND OF THE INVENTION

1. Field of the Invention

The present invention relates generally to integrated circuit devices. It particularly relates to a method and apparatus for improving bump formation in flip chip assemblies.

2. Background

In recent years, the usage of Flip-Chip technology has grown in electronics manufacturing. Flip-Chip is a process by which an integrated circuit (IC) is mounted on a substrate (e.g., ceramic, epoxy, etc.), and attached with electrically conductive (e.g., metallic) bumps. The unique aspect of such a chip is that it is mounted "upside-down", with the active side down. The IC is commonly soldered on to the substrate by thermocompression or heat-welding, and this process is commonly used on printed circuit boards (PCB) for small numbers of connections, in electronic products which must be very highly miniaturized.

Compared to traditional wire bonding interconnection, flip-chip technology offers tremendous advantages such as eliminating the need for wire bond connections, increasing input/output (I/O) density, and using less space on PCBs. By replacing a finite number of perimeter lead wires with an almost unlimited number of solder bumps between the chip and the substrate, flip-chip technology achieves higher I/O counts and faster operating speeds than wire bonding. Other advantages of flip-chip technology include eliminating conventional packaging to meet demanding high-speed electrical requirements while providing a true chip-scale form factor, and shortening electrical paths so unwanted effects such as inductance and noise are greatly reduced. Additionally, flip-chip technology allows higher-density packaging (e.g., 16 Die on DIMM—Dual In-Line Memory Module as FCOB—Flip Chip on Board vs. 8 Die on DIMM in BGA-Ball Gird Array format) and provides very good thermal applications in most applications.

Figure 1:
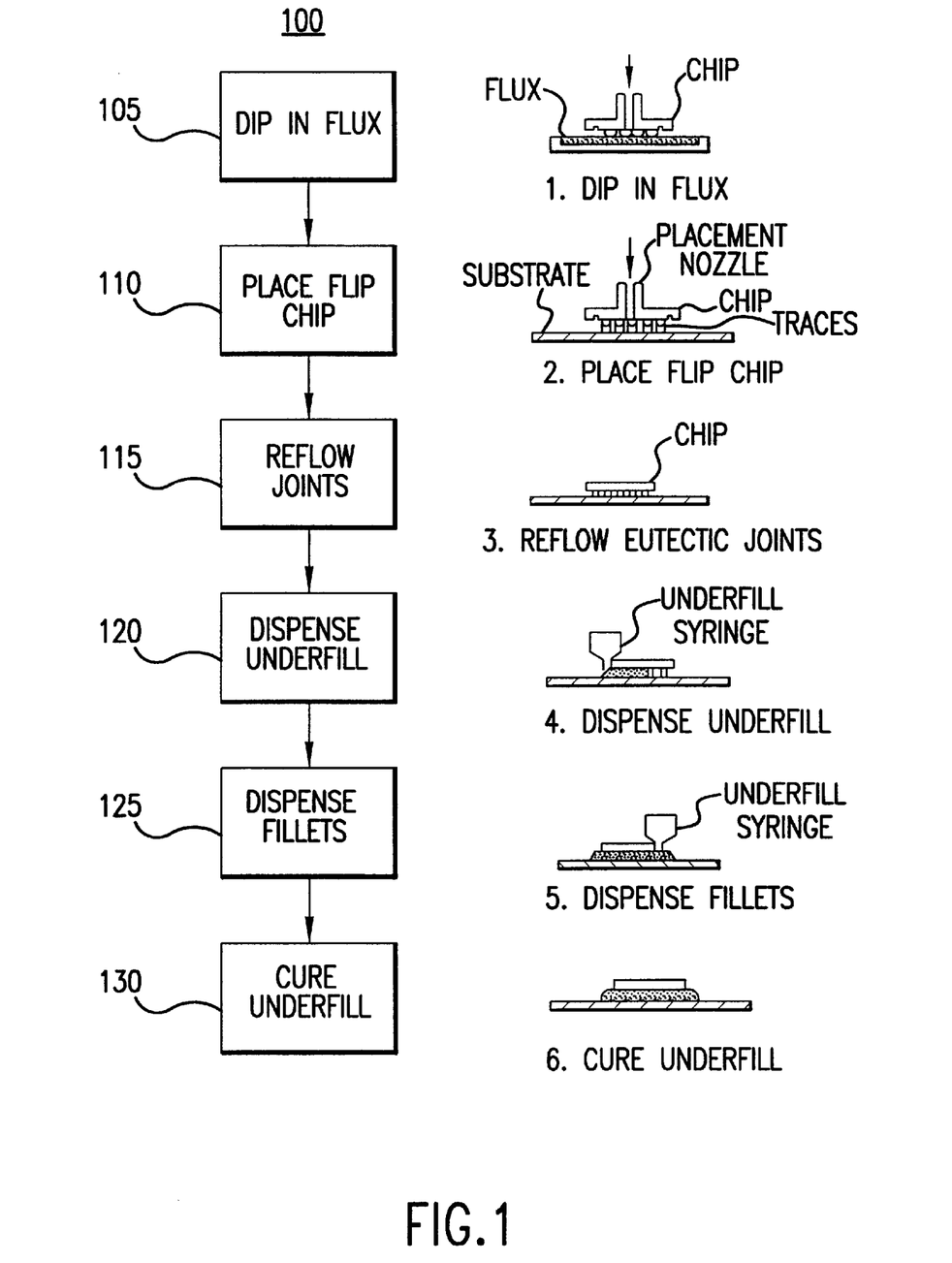
FIG. 1 illustrates a prior art flip-chip device process

FIG. 1 shows the typical process 100 followed in manufacturing flip-chip assemblies (devices). At step 105, a bumped-die (e.g. solder-bumped) is dipped into a thin film of flux. At step 110, the bumped-die is attached facedown on to a PCB (substrate). The solder provides mechanical, thermal, and electrical connections to the PCB. Preceding this step, there may be an alignment step where the bumps are aligned over the bond pads of the substrate. At step 115, solder reflow is applied to the device (assembly) to help stabilize the bump attachment (solder joints). At step 120, underfill material is applied between the flip chip and substrate along one or two edges of the die to minimize stress-induced failure of the solder interconnects. The underfill material is allowed to flow, by capillary action, between the device and the PCB through a small gap (e.g., typically less than 0.003 inches). At step 125, after the adhesive has completely underfilled the die, a fillet of the material is applied along the remaining edges of the chip to help reduce peripheral stress concentrations. Prior to the underfill application, the substrate may be preheated to very high temperatures (e.g., 80 to 100 degrees Celsius) to improve the flow characteristics of the underfill and reduce the risk of air voids ensuring a moisture-free substrate. Thereafter, at step 130, the underfill may be cured in an oven at elevated temperature (e.g., 150–170 degrees Celsius) over an extended period of time (e.g., 1–1.5 hours) to form void-free bonds that increase the thermal efficiency of the device and help reduce stress on the chip.

In flip-chip processing, the underfill materials are essential to flip-chip reliability by reducing and redistributing stresses and strains on the flip chip by minimizing coefficient of thermal expansion (CTE) mismatch among the chip, circuit board, and solder joints. Also, underfill materials improve thermal management of flip-chip devices by allowing rapid dissipation of heat through the back of the die.

However, despite the presence of the underfill materials, there still exists CTE mismatches, including physical and mechanical property mismatches, among the different materials forming the flip-chip device (e.g., lead, epoxy, ceramic, etc.) which leads to bump fatigue (e.g., formation of cracks) and premature device failure as the device goes through thermal cycling during operation. Therefore, to provide increased compliancy bumps that prevent premature device failure and reduce bump fatigue, there is a need to form bumps that adhesively bond to the substrate contact pads to form true covalently bonded devices with uniform mechanical and physical properties that lengthen flip-chip device operational life.

DETAILED DESCRIPTION

Figure 2:
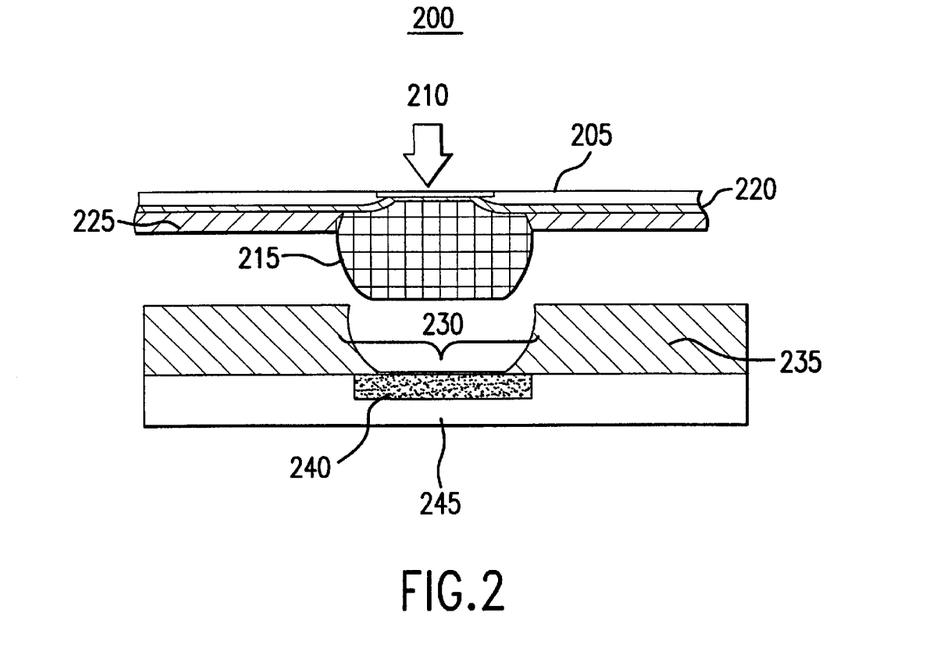
FIG. 2 illustrates a bumped die and a substrate in accordance with an embodiment of the present invention.

FIG. 2 illustrates a flip chip device (assembly) 200 including bumped die 205 and a substrate 245 in accordance with an embodiment of the present invention. The flip-chip device includes die (wafer) 205 having a wafer contact (bond) pad 210 that is flip-chipped on to substrate 245 having a substrate contact pad 240. The die 205 includes a plurality of layers including a base metal layer 220 formed prior to passivation layer 225. The passivation layer 225 may be formed using two different approaches. In a first embodiment, layer 225 may comprise a standard passivation layer formed from silicon nitride, oxynitride, cured polyimide, or another material that provides passivation. On top of this standard passivation layer, another layer is added that may be formed from a partially-cured, non-conductive (insulating) material (e.g., non-conductive benzocyclobutene—BCB). Layer 225 passivates to insulate and protect the underlying surface of die 205 and aids in creating a covalently bonded laminate structure (by reacting with other die 205 and substrate 245 elements) when die 205 and substrate 245 are brought together for bonding. In an alternative embodiment, layer 225 may be formed solely from a partially-cured, non-conductive material such as partially-cured, non-conductive BCB. In a further alternative embodiment, passivation layer 225 may be formed prior to metal layer 220. A polymer film (e.g., non-conductive BCB) may be spin-coated on to the surface of die 205, and then a base metal layer 220 (e.g., formed from Nickel-Gold) is formed on top of the polymer film using either electrolysis or electroplating.

Advantageously, above die contact pad 210, an electrically conductive polymer bump 215 is formed from materials that allow control of the degree of latency of the bump. These materials may include an electrically conductive paste material (ECP) including B-stage photo-defined conductive BCB that is partially cured (e.g., 75–80% degree of cure). On the substrate 245 in the area surrounding the contact pad 240, a non-conductive film 235 is formed from materials that similarly allow control of the degree of latency of the film and is partially cured (e.g., B-staged photo-defined non-conductive BCB). Also, an integral pocket structure (cavity or opening) 230 is formed above the substrate contact pad 240 for exposing the contact pad 240 to receive the conductive polymer bump 215 formed on the die 205 which provides electrical connection between the die contact pad 210 and substrate contact pad 240.

Advantageously, in accordance with embodiments of the present invention, the materials forming layers 225, 235, including bump 215, of die 205 and substrate 245 provide connection between die contact pad 210 and substrate contact pad 240. Also, layers 225, 235, including bump 215, may include materials having physical and chemical properties allowing control of the degree of latency of these layers (and bump). This control of the degree of latency, inherent from the properties of the materials forming these layers, enables tailoring of the degree of cure for these layers to produce a desired, final flip chip structure that is a covalently bonded laminate structure. These materials, with properties allowing control of the degree of latency, may include B-staged photo-definable non-conductive (or conductive) benzocyclobutene (BCB) that is partially cured (e.g., 75–80% degree of cure) and may be spin-coated to form layer 225 and bump 215. Also, these materials (e.g., BCB) may be printed on to the surface of substrate 245 to form film 235.

Figure 3:
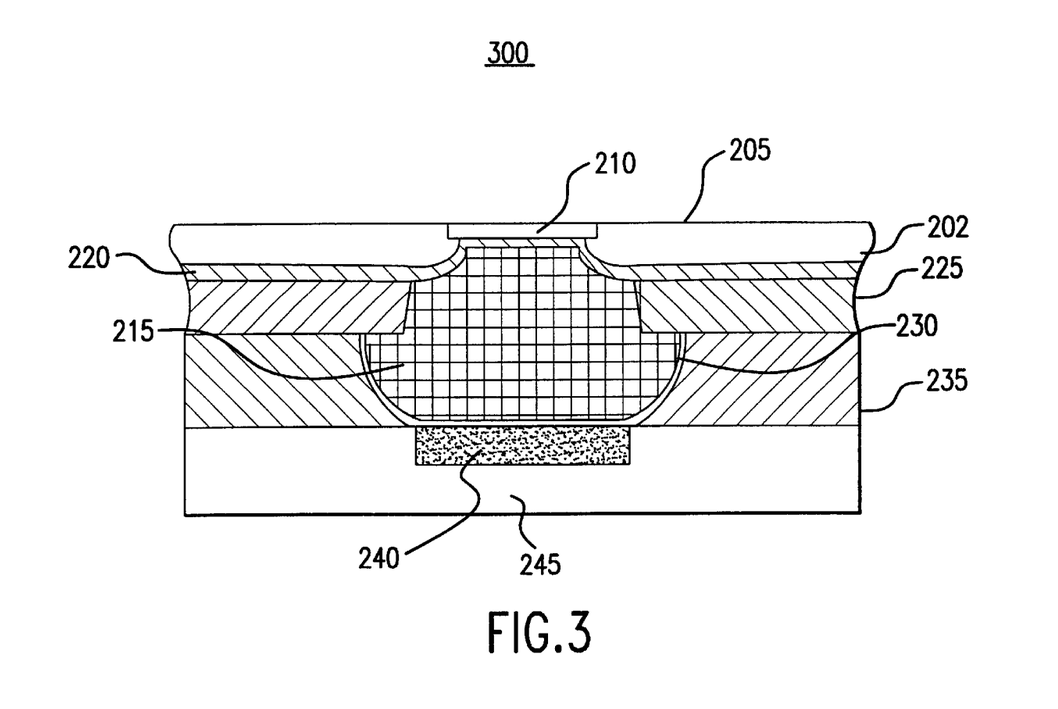
FIG. 3 illustrates a bumped die bonded to a substrate in accordance with an embodiment of the present invention.

As shown in FIG. 3, the die 205 and substrate 245 are brought together (attached by contacting the bump 215 with the contact pad 240) to adhere (creating an adhesive bond) the bump 215 to the substrate contact pad 240 via non-conductive film 235. Also, as part of this adhering process, bump 215, non-conductive film 235, and layer 225 react (chemically) to form a covalently bonded laminate structure 300 when the bump 215, film 235, and layer 225 are fully cured (post-cured). Structure 300 may be produced by post-curing reactive layers 225, 235, and bump 215 at 250 degrees Celsius for 100 to 180 minutes in an environment with less than 10 ppm (parts per million) oxygen. This post-curing completes polymerization of the reactive (e.g., BCB) layers to yield the covalently bonded laminate structure 300.

Advantageously, in accordance with embodiments of the present invention, the die (wafer) contains an integrated circuit (IC) of which contact pad 210 and layer 220 form a part. Also, substrate 245 and contact pad 240 may form part of a printed circuit board (PCB) where the bond produced between the bump 215 and contact pad 240 allows for mechanical, thermal, and electrical connection between the IC and PCB. The latency of the different polymer elements, including the polymer bump 215, insulating die polymer layer 225, and the non-conductive substrate film 235, produce covalent adhesive bonding between these elements to form flip-chip device 200 that will display uniform mechanical and physical properties to lengthen operative life. Advantageously, die 205 may include a plurality of polymer bumps 215 and substrate 245 may include a plurality of contact pads 240, exposed by openings 230, for receiving the plurality of bumps where the pattern of bumps correspond to the pattern of contact pad openings to form the bonded structure.

In accordance with embodiments of the present invention, the polymer bumps 215 may be formed from Dow 3022-63 BCB, and filled with 50–200 weight % conductive filler. The polymer bumps 215 may be stencil printed or spin coated on to the wafer contact pads 210. The substrate film 235 may be formed from a plurality of photodefinable BCB formulations, including Dow 4026-46, that is printed on to the substrate surface 245 and photo-defined such that the contact pads 240, exposed by openings 230, may receive the polymer bumps.

In accordance with embodiments of the present invention, polymer bumps 215 and substrate film 235 may be partially cured to 75–80% DOC (degree of cure). After bringing die 205 and substrate 245 together to adhesively bond polymer bump 215 to contact pad 240, and to covalently bond bump 215 with film 235 and layer 225, the resulting structure may be post-cured at 250 degrees Celsius for 100 to 180 minutes in an environment with less than 10 ppm oxygen. This post-curing process completes the polymerization of the surfaces/elements including BCB to form the covalently bonded laminate structure 300 illustrated in FIG. 3.

Figure 4:
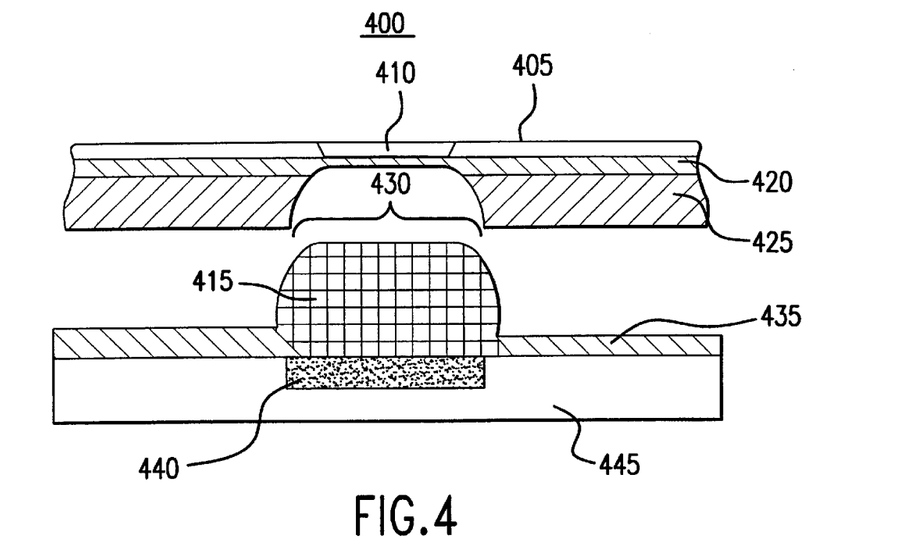
FIG. 4 illustrates a bumped substrate and a die in accordance with an alternative embodiment of the present invention.
Figure 5:
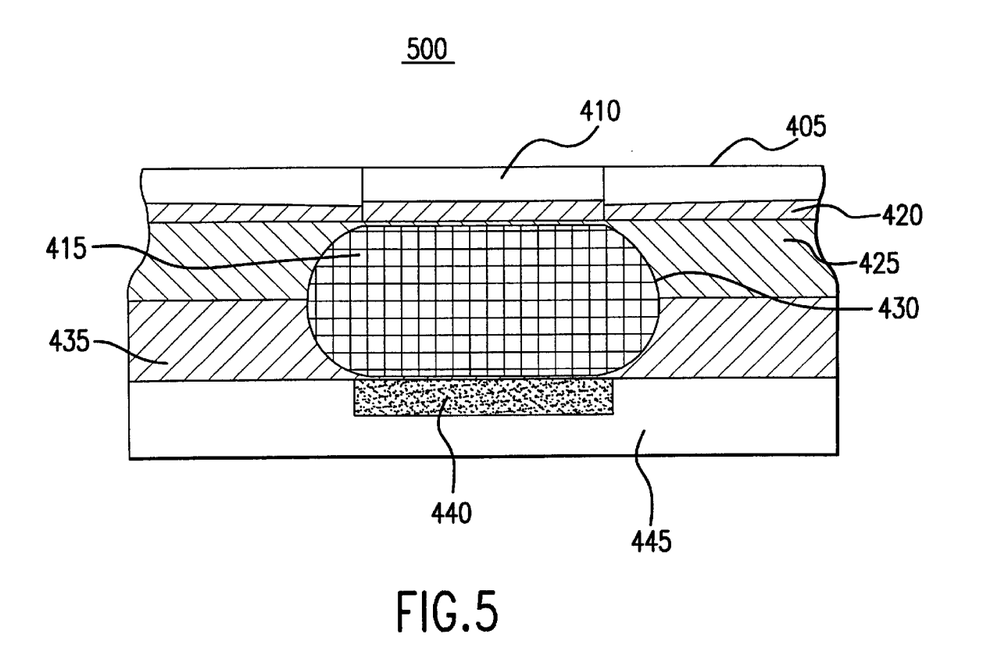
FIG. 5 illustrates a bumped substrate bonded to a die in accordance with an alternative embodiment of the present invention.

FIG. 4 illustrates an alternative embodiment of the present invention, to that shown in FIG. 2, where the flip-chip device 400 may have a non-conductive film 425 coated instead on to a die surface 405 including on top of and in the area surrounding a die contact pad 410. Also, substrate 445 includes a non-conductive film coating 435. An opening (or cavity) 430 is created in the film 425, below the die contact pad 410, for receiving a polymer bump 415, formed on substrate 445 on top of contact pad 440, to produce the covalently bonded structure 500, as shown in FIG. 5, when the substrate 445 and die 405 are brought together (attached) and the films 425, 435 and bump 415 are fully cured (post-cured).

The die 405 includes a plurality of layers including a base metal layer 420 formed prior to passivation layer 425. The passivation layer may be formed using two different approaches. In a first embodiment, layer 425 may comprise a standard passivation layer formed from silicon nitride, oxynitride, cured polyimide, or another material that provides passivation. On top of this standard passivation layer, another layer is added that may be formed from a partially-cured, non-conductive (insulating) material (e.g., non-conductive benzocyclobutene—BCB). Layer 425 passivates to insulate and protect the underlying surface of die 405 and aids in creating the covalently bonded laminate structure (by reacting with bump 415 and film 435) when die 405 and substrate 445 are brought together for bonding. In an alternative embodiment, layer 425 may be formed solely from a partially-cured, non-conductive material such as partially-cured, non-conductive BCB. In a further alternative embodiment, passivation layer 425 may be formed prior to metal layer 420. A polymer film (e.g., non-conductive BCB) may be spin-coated on to the surface of die 405, and then a base metal layer 420 (e.g., formed from Nickel-Gold) is formed on top of the polymer film using either electrolysis or electroplating.

Layers 425, 435, including bump 415, may include materials having physical and chemical properties allowing control of the degree of latency of these layers (and bump). This control of the degree of latency, inherent from the properties of the materials forming these layers, enables tailoring of the degree of cure for these layers to produce a desired, final flip chip structure that is a covalently bonded laminate structure. These materials, with properties allowing control of the degree of latency, may include B-staged photo-definable non-conductive (or conductive) benzocyclobutene (BCB) that is partially cured (e.g., 75–80% degree of cure) and may be spin-coated to form layers 425, 435 and bump 415. Also, these materials (e.g., BCB) may be printed on to the surface of substrate 445 to form film 435. After bringing die 405 and substrate 445 together to bond (adhesively) polymer bump 415 to contact pad 440, via film 435, the resulting structure may be post-cured at 250 degrees Celsius for 100 to 180 minutes in an environment with less than 10 ppm oxygen. This post-curing process completes the polymerization of the surfaces/elements including BCB to form the covalently bonded laminate structure 500 illustrated in FIG. 5 as bump 415, film 435, and layer 425 chemically react to form the covalent bond.

Figure 6:
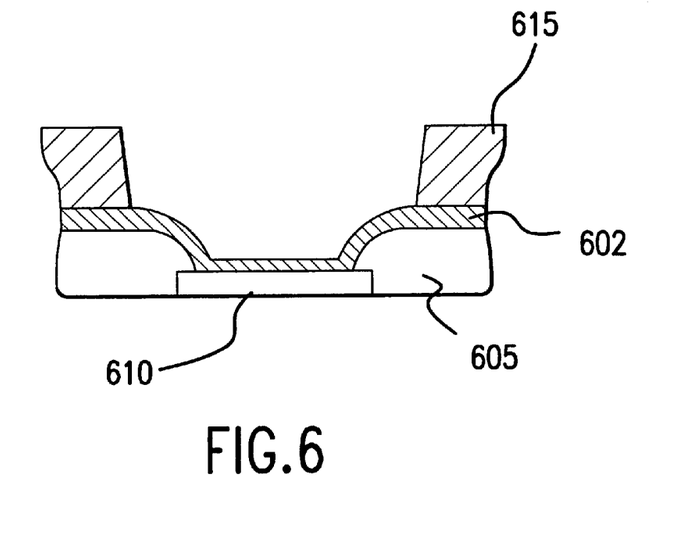
FIG. 6 illustrates a die with a collar in accordance with another alternative embodiment of the present invention.

FIG. 6 illustrates an alternative embodiment of the present invention where die 605 includes a collar 615 formed from materials allowing control of the degree of latency of collar 615 to improve inter-component adhesion. Collar 615 may be formed from low modulus materials (e.g., BCB) to provide a compliant stress relieving interface between the die structure 605 and a bump that will subsequently be formed within the collar. Advantageously, in accordance with embodiments of the present invention, the collar 615 may have a modulus in the range of 0.5 to 6 GPa (Giga-pascals), and may be formed from B-staged, photo-defined, non-conductive polymers including epoxy, BCB, silicone, and other materials. Die 605 further includes a contact pad 610, and a base metal layer 602 (e.g., Ti/NiV—titanium/nickel vanadium, electoless Ni/Au nickel/gold) formed prior to collar 615. Collar 615 may built on top of a passivation layer (not shown) that is formed from silicon nitride, oxynitride, cured polyimide, or another material that provides passivation. Alternatively, the passivation layer, similar to collar 615, may be formed from a partially-cured, non-conductive material such as BCB. Collar 615 may be produced by spin-coating photo-definable BCB film materials and defining the collar 615 on top of layer-603.

Figure 7:
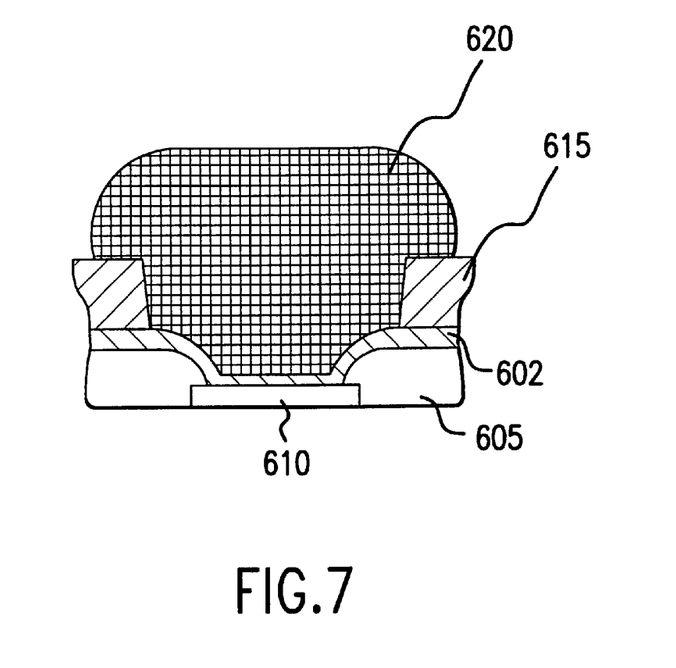
FIG. 7 illustrates a die with a bumped collar in accordance with another alternative embodiment of the present invention.

FIG. 7 illustrates a bump 620 formed within (e.g., inside the diameter) collar 615. Bump 620 may from a plurality of materials including solder paste combinations (e.g., tin/lead, tin/silver/copper, tin/silver, etc.),and electrically conductive polymer pastes (e.g., silver-filled BCB, epoxy, etc.). The collar 615 provides a compliant, reactive surface interface between a polymer bump 620 and the die 605 to better distribute loads that improves bump life. Bumps formed within the collar 615 may be produced from a plurality of materials and processes including stencil printed solder paste, electroplated solder, and ECP bumps.

Figure 8:
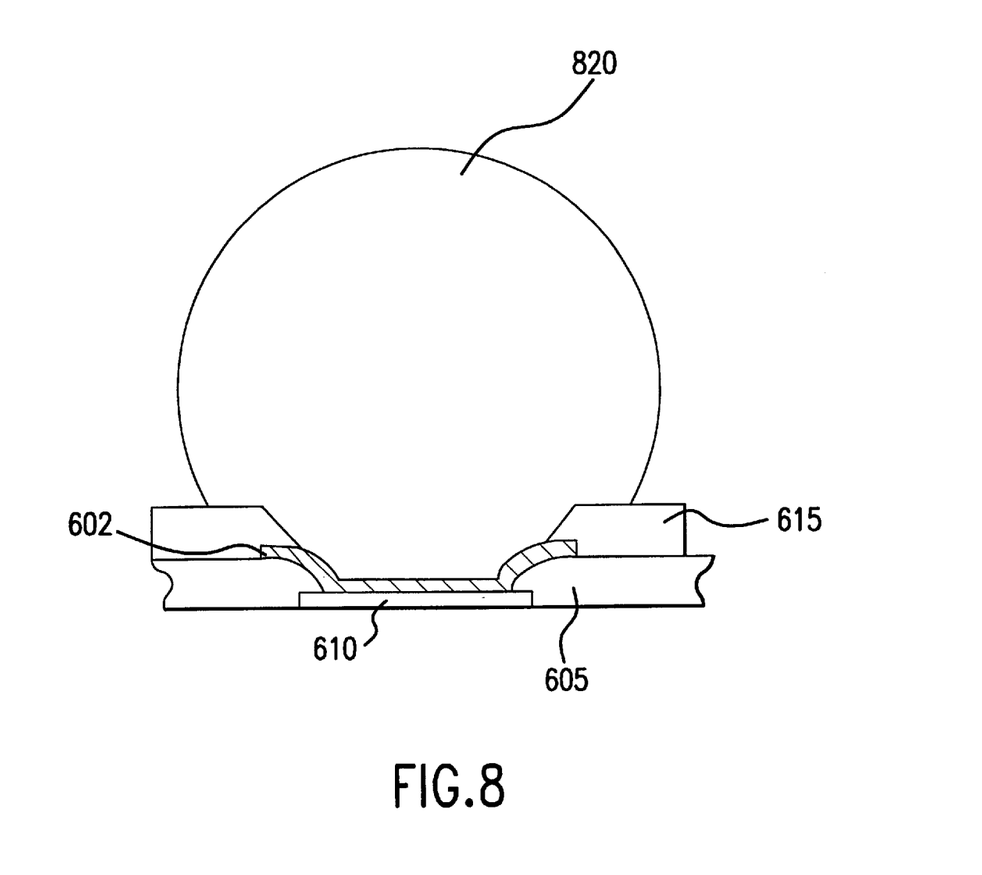
FIG. 8 illustrates a die with a bumped collar in accordance with an another alternative embodiment of the present invention.
Figure 9A:
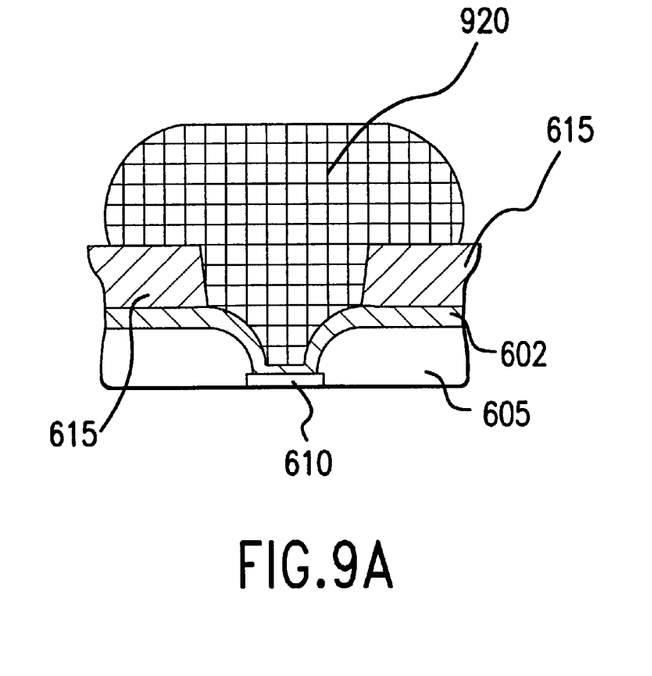
FIG. 9a illustrates a die with a bumped collar in accordance with an another alternative embodiment of the present invention.
Figure 9B:
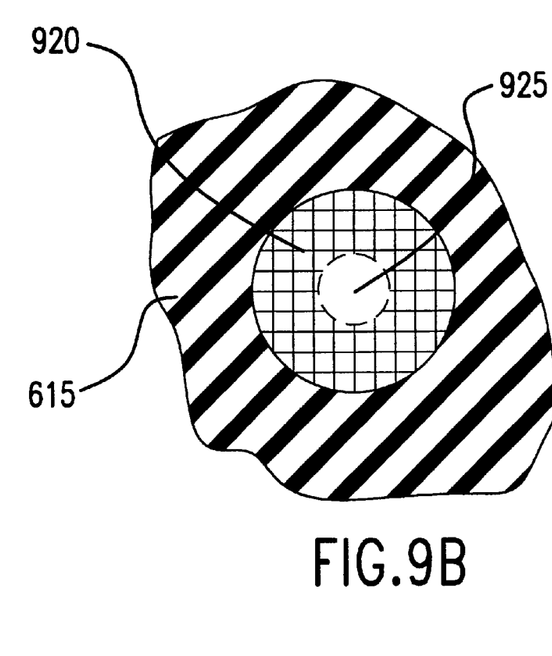
FIG. 9b illustrates an alternative view of a die with a bumped collar in accordance with another alternative embodiment of the present invention.

FIG. 8 illustrates a solder bump 820 that may be formed within collar 615 after the reflow step in flip-chip processing. FIG. 9a illustrates a stencil printed solder bump 920 formed within collar 615. A stencil for soldering is formed with a pattern of apertures that corresponds to the pattern of apertures (openings) formed in the die passivation layer 605 exposing the die contact pads 610. FIG. 9b illustrates an alternative view of collar 615 and bump 920 with an opening 925 residing inside bump 920 prior to reflow.

Figure 10:
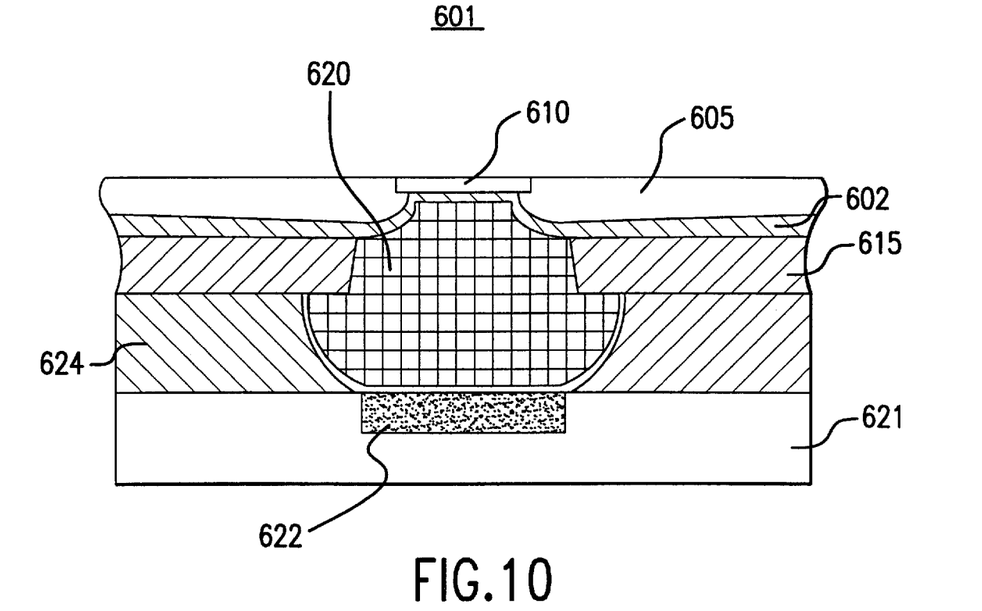
FIG. 10 illustrates bumped collar bonded to a substrate in accordance with an alternative embodiment of the present invention.

FIG. 10 illustrates a covalently bonded laminate structure 601 with the collar embodiment where die 605, including collar 615, has been brought together with substrate 621. After bringing die 605 and substrate 621 together to bond (adhesively) polymer bump 620 to contact pad 622, via film 624, the resulting structure may be post-cured at 250 degrees Celsius for 100 to 180 minutes in an environment with less than 10 ppm oxygen. This post-curing process completes the polymerization of the surfaces/elements including BCB to form the covalently bonded laminate structure 601 illustrated in FIG. 10 as bump 620, film 624, and collar 615 chemically react to.form the covalent bond.

Figure 11:
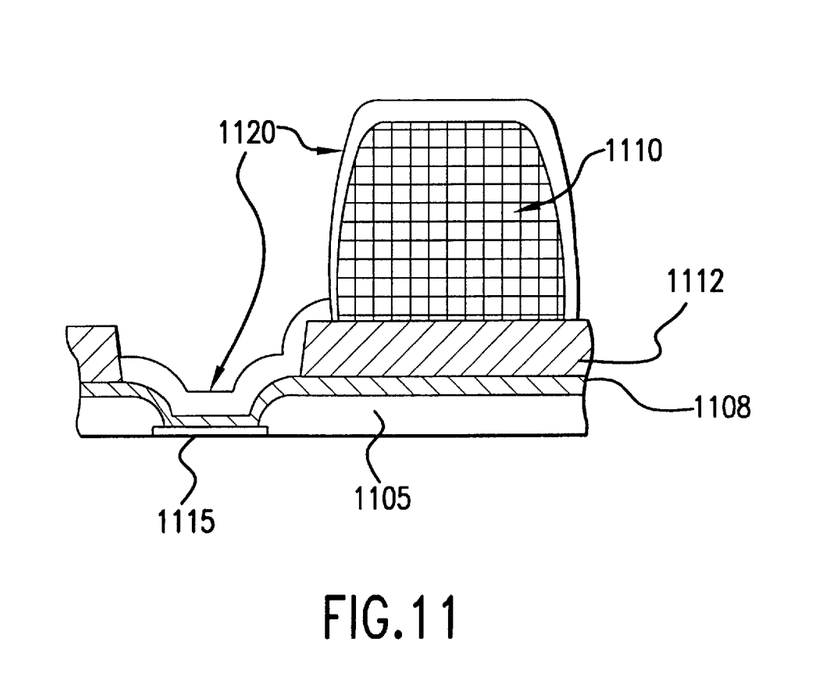
FIG. 11 illustrates a die with a separated bump in accordance with a further alternative embodiment of the present invention.

FIG. 11 illustrates an "off-pad" embodiment of the present invention where the formed bump 1110 is separated from die contact pad 1115. Die structure 1105 includes die contact pad 1115, a base metal layer 1108, and then a non-conductive film (e.g., BCB) layer 1112 that is coated on top of the base metal layer 1108. Alternatively, film layer 1112 may built on top of a passivation layer that is formed from silicon nitride, oxynitride, cured polyimide, or another material that provides passivation. In an alternative embodiment, base metal layer 1108 may only cover the die contact pad 1115, and then the non-conductive film (e.g., BCB) layer 1112 is coated over the surface of the die (e.g., silicon) 1105.

In accordance with embodiments of the present invention, film layer 1112 may be spin-coated on to the die 1105. Bump 1110 may be formed from an ECP material (e.g., BCB) or from a non-conductive material (e.g., BCB). Die 1105 further includes a metallization layer 1120 covering the bump 1110 and contact pad 1115 using processes such as sputter coating, vapor deposition, or other processes for producing the conductive, metallized layer 1120. Metallization layer 1120 provides an electrical connection between the bump 1110 and die contact pad 1115.

Figure 12A:
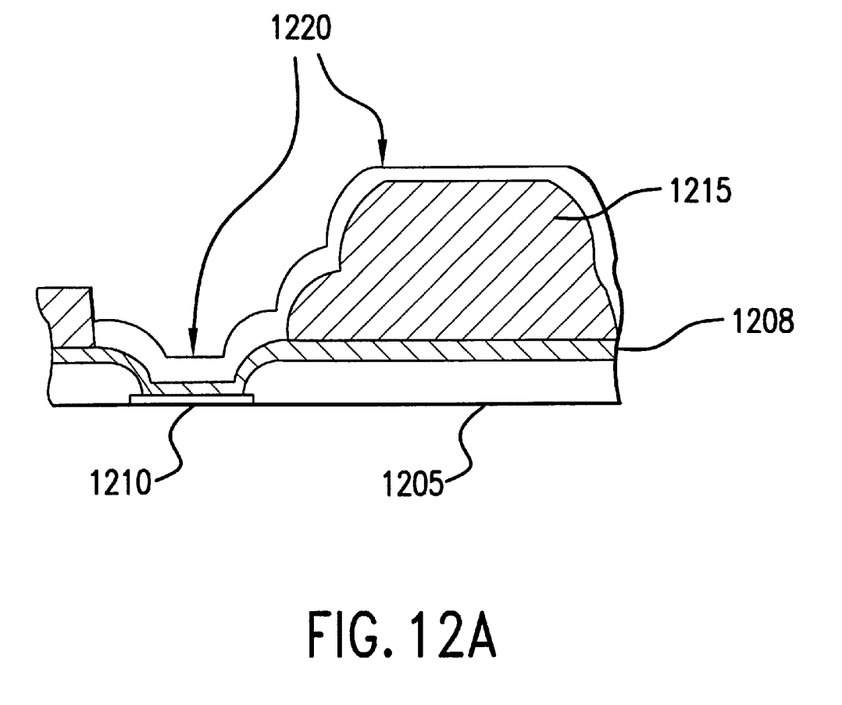
FIG. 12a illustrates a die with a separated bump in accordance with another further alternative embodiment of the present invention.

FIG. 12a illustrates an alternative embodiment of the die and bump structure shown in FIG. 11. In FIG. 12a, a monolithic (formed of the same materials as a preceding layer in the die 1205) bump 1215 is formed "off-pad" from a die contact pad 1210. The die 1205 includes a base metal layer 1208, and a metallization layer 1220 covering the bump 1215 and contact pad 1210 to provide an electrical connection between bump 1215 and contact pad 1210. Alternatively, bump 1215 may be built on top of a passivation layer that is formed from silicon nitride, oxynitride, cured polyimide, or another material that provides passivation. Advantageously, the bump height may be from 9–26 micrometers (um) and may be formed from a combination of processes including coating, baking, developing, etching, and stripping.

Figure 12B:
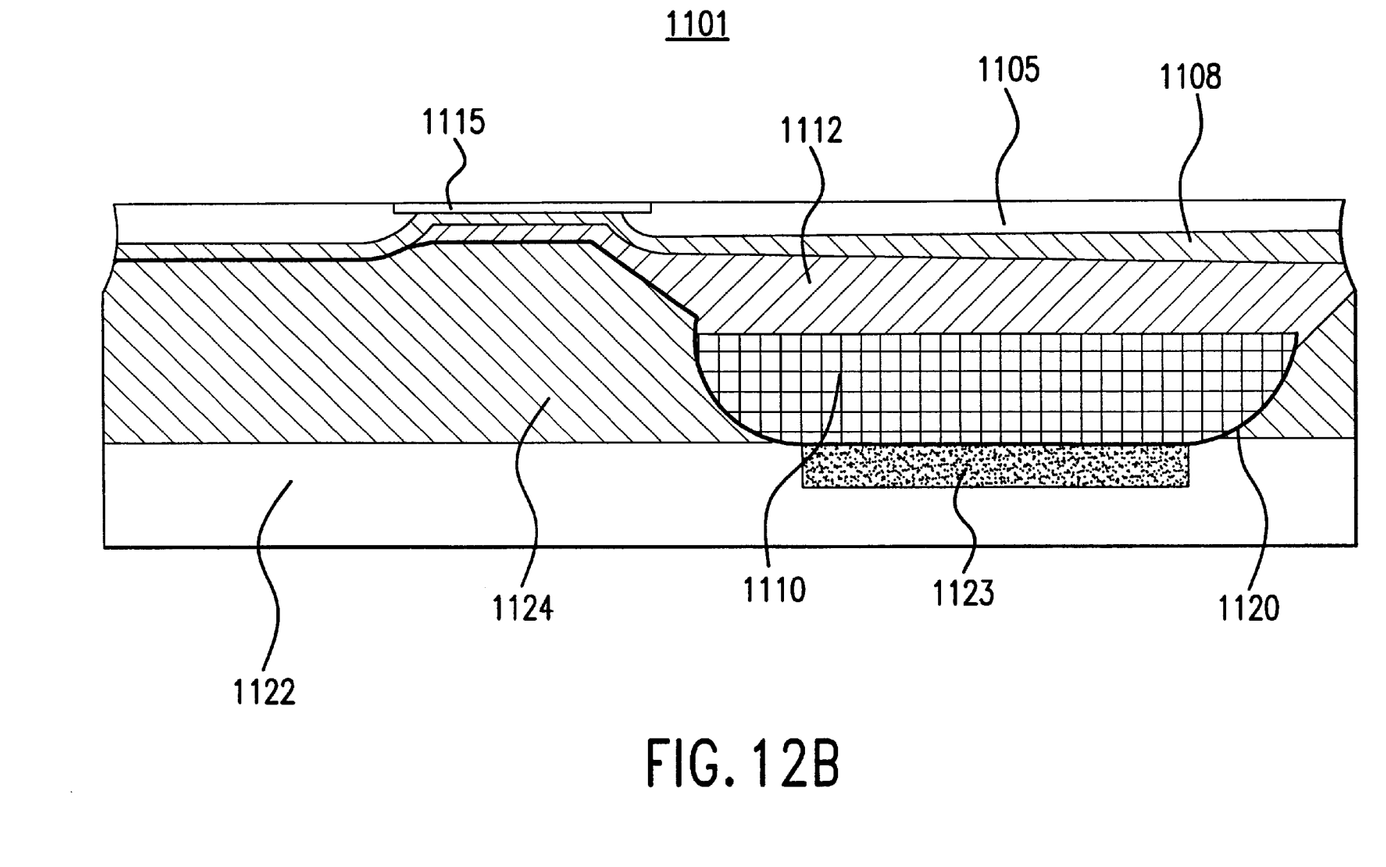
FIG. 12b illustrates a die with a separated bump bonded to a substrate in accordance with a further alternative embodiment of the present invention. in accordance with a further alternative embodiment of the present invention.

FIG. 12b illustrates a covalently bonded laminate structure 1101 of the "off-pad" embodiment where die 1105 has been brought together with substrate 1122. After bringing die 1105 and substrate 1122 together to bond (adhesively) polymer bump 1110 to contact pad 1123, via film 1124, the resulting structure may be post-cured at 250 degrees Celsius for 100 to 180 minutes in an environment with less than 10 ppm oxygen. This post-curing process completes the polymerization of the surfaces/elements including BCB to form the covalently bonded laminate structure 1101 illustrated in FIG. 12b as bump 1110, film 1124, and layer 1112 chemically react to form the covalent bond.

Figure 13:
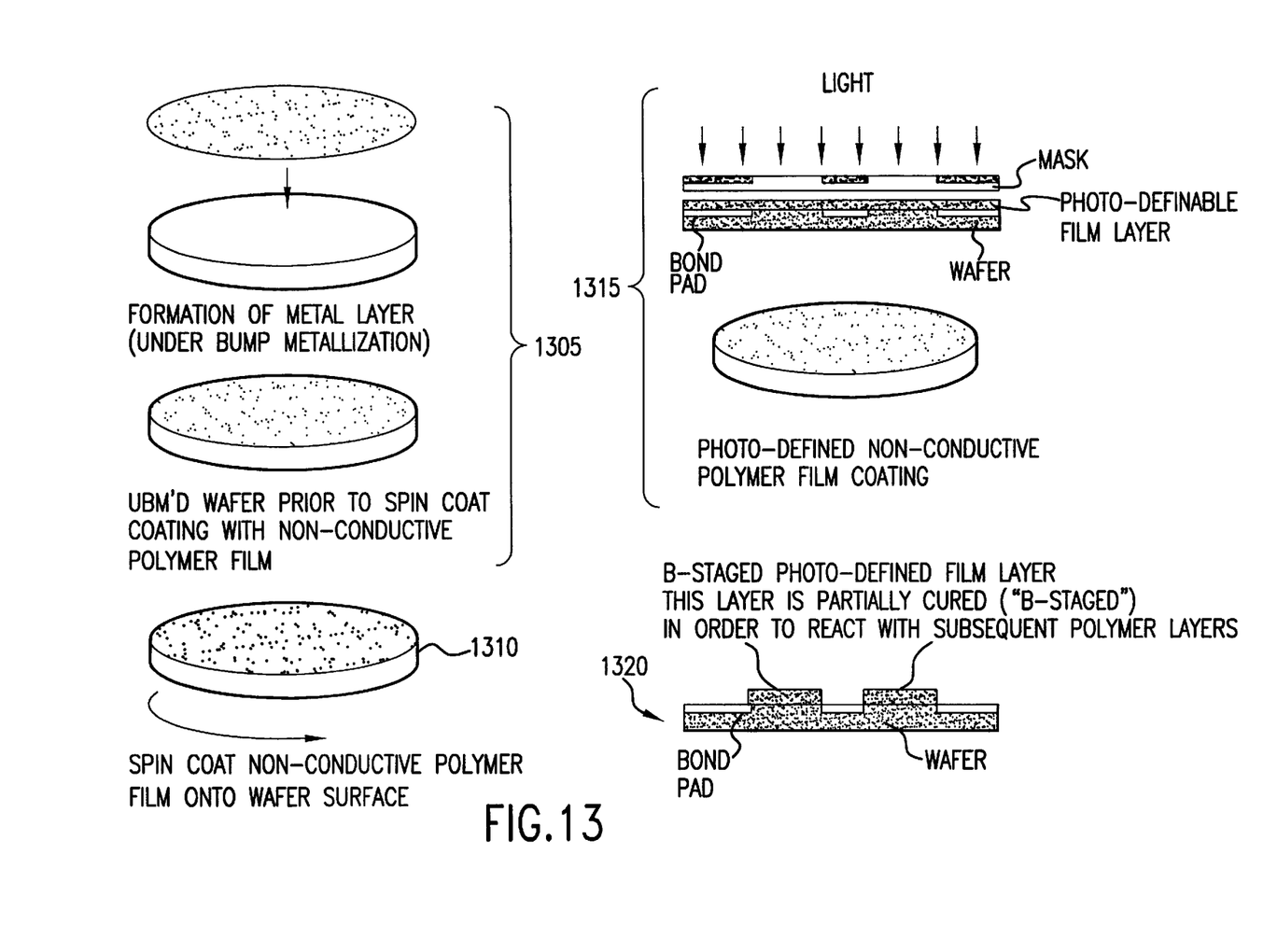
FIG. 13 illustrates process methods for forming bumps in accordance with an embodiment of the present invention.
Figure 14A:
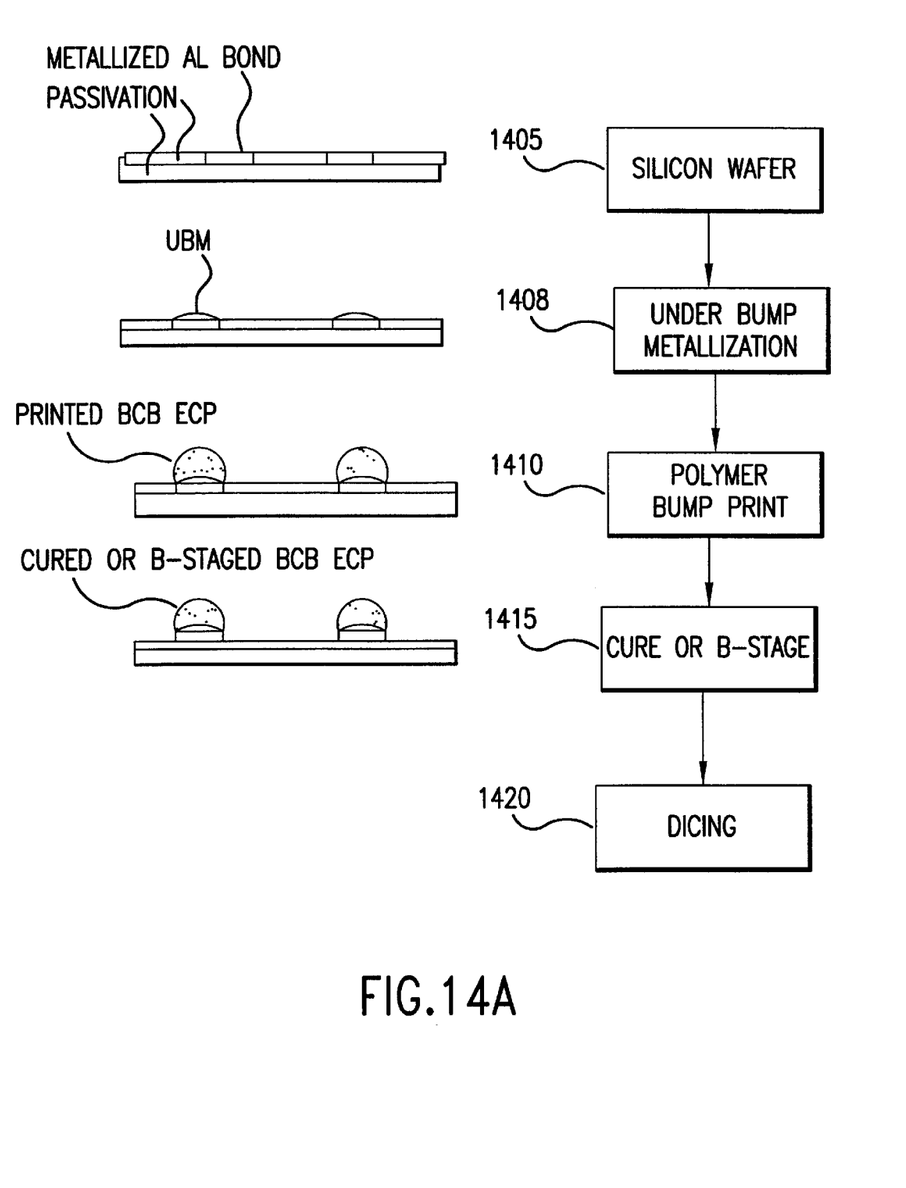
FIGS. 14a,b illustrate process methods for forming bumps in accordance with an alternative embodiment of the present invention.
Figure 14B:
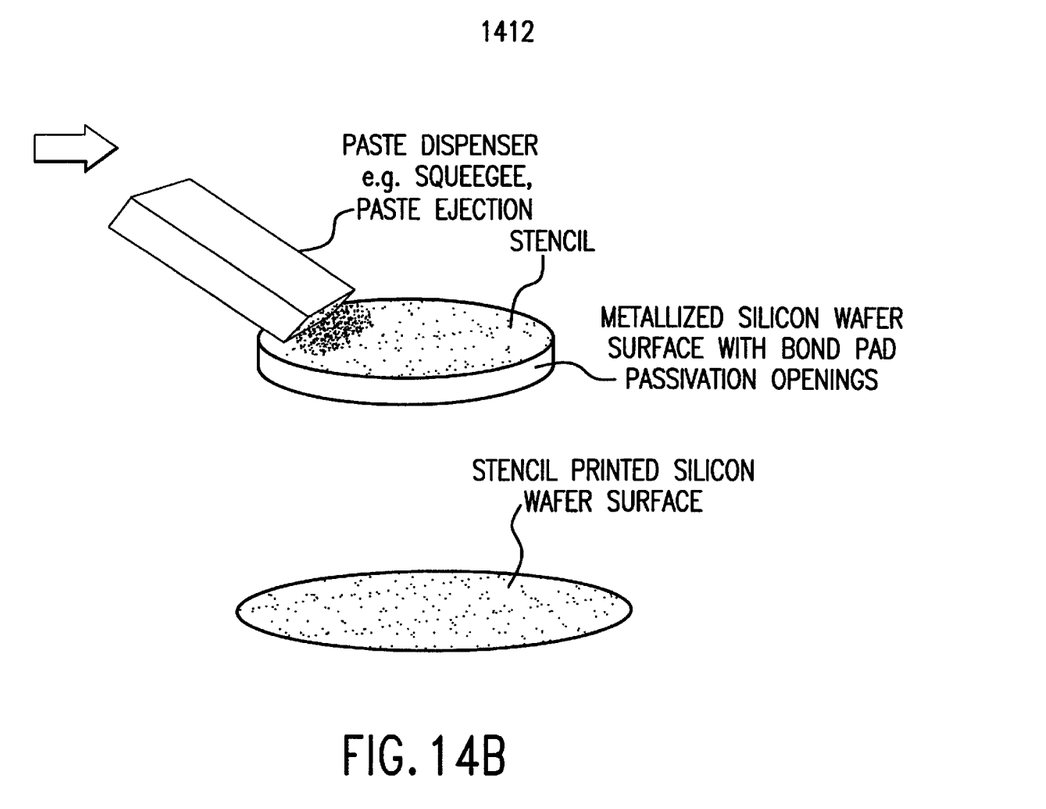

FIGS. 13, 14a, and 14b show bump formation processes in accordance with embodiments of the present invention. In FIG. 13, the steps are illustrated for spin-coating the bumps on to the die (wafer) where the die may include a plurality of contact pad openings (pockets). At step 1305, a metal layer is formed on the die (wafer) surface during a process of under-bump metallization (UBM). Extraneous metal may be etched away to form a pre-determined pattern for the metal layer. At step 1310, the die is spin-coated to form a polymer film that is filled with materials including those allowing control of the degree of latency of the film (e.g., photo-definable BCB). After this step, a mask is added to cover the die while leaving exposed the pocket areas of polymer film covering the contact pads. At step 1315, the polymer material is photo-defined to expose the die contact pads (left exposed by the mask) to light to trigger the pre-determined chemical reaction for forming the polymer bumps. At step 1320, the material may be partially-cured to 75–80% degree of cure to react to subsequent polymer layers formed later on the die and/or on a substrate. Following this step, a solvent may be used to dissolve off extraneous (left unreacted during step 1315) BCB to form a desired die bump structure. In accordance with embodiments of the invention, use of spin-coating processing to form the polymer bumps enables tighter (reduced) bump pitch (distance between bumps) and reduced bump height or thickness (lower Z). For example, the bump pitch may be reduced to the range of approximately 10 micrometers, and the bump height (thickness) may be reduced to the range of approximately 10–50 micrometers.

In FIGS. 14a, b the steps are illustrated for stencil printing the bumps on to the die (wafer). At steps 1405, 1408, a silicon wafer is formed and the wafer undergoes under bump metallization to create a die that has a metallized surface (including a passivation layer) with bond (pad) openings in the die. At step 1410, the polymer bump is stencil printed on to the die contact pads. This step includes the substep 1412 of dispensing the ECP on to the die using a paste dispenser which may include a squeegee, paste ejection cartridge, or other suitable dispenser, and then stenciling the ECP on to the die surface. A stencil for soldering is formed with a pattern of apertures that corresponds to the pattern of apertures (openings) formed in the die passivation layer exposing the die contact pads. At step 1415, the polymer bump is cured or B-staged (partially-cured). At step 1420, the wafer is diced to form a plurality of integrated circuit packages.

In accordance with embodiments of the present invention, the use of BCB for the material forming the substrate film and polymer bump provides several advantages over other materials. These advantages include the following: a) relatively higher temperature gradient (e.g., 300–350 degrees Celsius (C) vs. 65 C to 165 C for epoxy), b) lower moisture absorption (e.g., 0.05 to 0.14% by weight for BCB vs. 0.7 to 1.2% for epoxy), and c) lower stress factor (e.g., lower modulus, CTE, and longer elongation vs. higher modulus, CTE, and shorter elongation for epoxy). These advantages lead to longer flip-chip device life by decreasing bump fatigue and improving electrical performance by reducing conductive particle migration within the completed structure.

Additionally, due to the useful physical and mechanical properties of BCB, low-cost, high-compliancy, and high performance polymer bumps may be formed and compounded ECP formulations may be produced to enable higher conductive particle loading to further improve electrical performance. As an example, the modulus of typical eutectic solders (63 Sn/37 Pb) is approximately 30 GPa, while the modulus of no-Pb (no-lead) solders range from approximately 50 GPa (96.5 Sn/3.5 Ag) to 10 GPa for Cu. As an improved alternative, ECP BCB bumps, in accordance with embodiments of the present invention, have a lower modulus in the range of 2–4 GPa that further improves (increases) bump fatigue life through their increased compliance. The increased compliance of these polymer bumps enables greater tolerance to strain without fracturing (during thermal cycling of the integrated circuit) that improves the reliability of the integrated circuit.

Also, embodiments of the present invention produce a flip-chip device that provides improved reliability and performance from decreased warping and absorption, better stress distribution from thermal loading, and a laminate structure (eliminating the need for underfill materials) in which the bump and substrate are covalently bonded because similar materials (e.g., BCB) have been used to form the bumps and substrate films. BCB has the physical property of being able to tailor its latent reactivity as a function of thermal history. Embodiments of the present use this property to form partially-cured polymer bumps and substrate films that may be covalently bonded to each other using flip-chip assembly processes.

In an exemplary embodiment similar to those previously described herein, a Dow BCB formulation 3022-63 may be filled with 100 weight % silver flake particles to form a polymer bump (formed on a die contact pad) that can be "soft cured" to 75–80% degree of cure (DOC). Another unfilled BCB formulation, soft-cured to 75–80% degree of cure, may be used to coat the substrate (formed above and around a substrate contact pad) in a pattern where complimentary bump openings are present. Subsequently bringing together the die and substrate contact pad forms a monolithic interface where the polymer bumps and locked into the substrate and co-cured to produce a covalently bonded structure where DOC/temperature and DOC/bond strength relations have been pre-determined to produce the resulting laminate structure.

Figure 15:
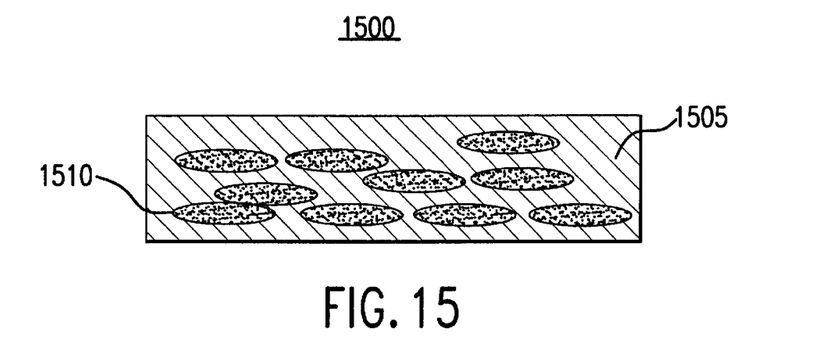
FIG. 15 illustrates a prior art electrically conductive paste.

In accordance with embodiments of the present invention, electrically conductive paste (ECP) may be formed using a plurality of methods. ECP may be used for producing ICs structures such as the flip chips described herein, collapse chip (C4) connections, or other applications. FIG. 15 illustrates prior art epoxy ECP. The epoxy ECP composition 1500 includes a plurality of electrically conductive silver flake filler particles 1510 dispersed within an epoxy matrix material 1505 (e.g., resin) to produce the epoxy ECP used for forming prior art flip-chip bump structures.

Figure 16:
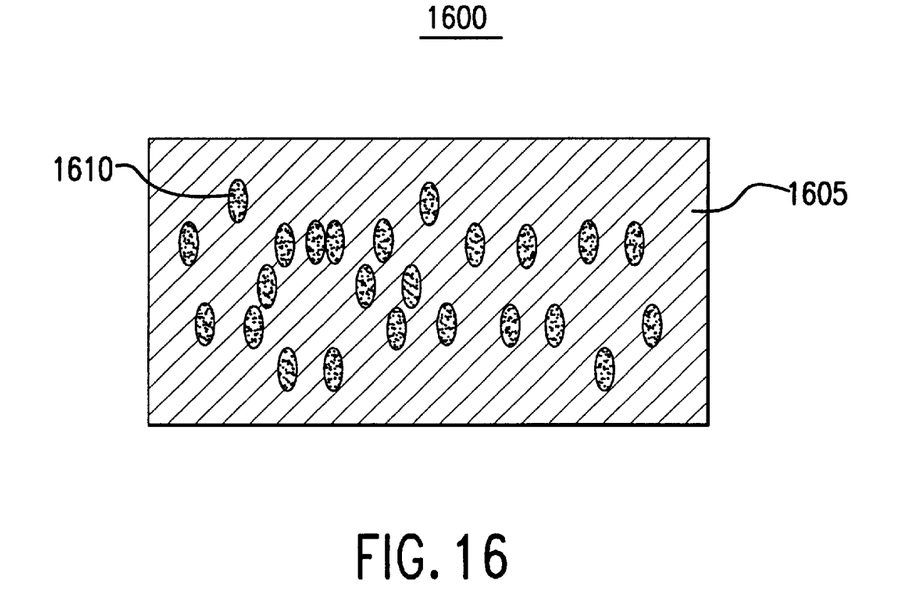
FIG. 16 illustrates an electrically conductive paste in accordance with an embodiment of the present invention.

FIG. 16 illustrates BCB ECP in accordance with an embodiment of the present invention. The BCB ECP composition 1600 includes a plurality of electrically conductive spherical filler particles 1610 dispersed within a BCB matrix material 1605 (e.g., resin) to produce the ECP BCB with physical/mechanical properties useful for forming flip-chip bump structures.

Figure 17:
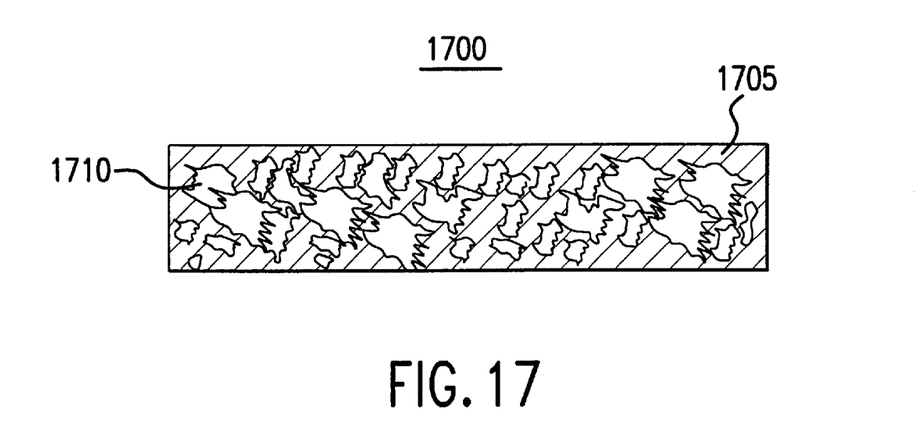
FIG. 17 illustrates an electrically conductive paste in accordance with an alternative embodiment of the present invention.

Alternatively, FIG. 17 illustrates BCP ECP in accordance with an alternative embodiment of the present invention. The BCB ECP composition 1700 includes a plurality of electrically conductive irregularly-shaped filler particles 1710 dispersed within a BCB matrix material 1705 (e.g., resin).

Advantageously, in accordance with embodiments of the present invention, the ECP electrically conductive filler particles may be spherical or irregularly shaped flakes having high hardness, and may include combinations of Ag (silver), Sn (tin), In (indium), Bi (bismuth), Pd (palladium), Pt (platinum), Ni (nickel), Cu (copper), Zn (zinc), alloys of these materials, or metallic coated inorganic particles or polymer particles dispersed in the BCB matrix.

In accordance with embodiments of the present invention, the particle size may be in the range of 0.1 microns to 100 microns depending on the desired structure. Concentration of the conductive particles may be in the range of 50 to 200% by weight (particle to BCB) and ECP viscosity is in the range of 1000 to 10000 cPS allowing for patterning and formation of flip-chip bump structures using stencil printing or processes. Advantageously, BCB has a glass transition temperature (Tg) greater than the expected service temperature (e.g., Tg>350 C and service temperature<260 C) thus allowing for essentially linear mechanical behavior throughout the flip-chip device's anticipated service environment.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit device, comprising:
   a die having a plurality of contacts;
   a substrate having a plurality of contact pads;
   a plurality of bumps formed on one of said contacts and contact pads;
   a plurality of pockets formed on other of said contacts and contact pads; and
   the bumps and pockets forming a covalently bonded structure.

2. The integrated circuit device of claim 1, wherein said bumps being formed from a polymer.

3. An integrated circuit device, comprising:
   a die including a plurality of bumps initially formed from partially-cured electrically conductive polymer materials;
   a substrate including a plurality of contact pads, and a film, initially formed from partially-cured electrically non-conductive materials, surrounding each contact pad such as to expose the contact pads; and
   the bumps and non-conductive film forming a covalently bonded laminate structure.

4. The integrated circuit device of claim 3, wherein the bumps and the film being formed from materials allowing control of the degree of latency of the bumps and the film.

5. The integrated circuit device of claim 4, wherein the materials include benzocyclobutene.

6. The integrated circuit device of claim 3, wherein the covalently bonded structure being formed of materials having equivalent coefficients of thermal expansion.

7. The integrated circuit device of claim 3, wherein the pattern of bumps on the die correspond to the pattern of contact pad openings on the substrate.

8. An integrated circuit device, comprising:
   a substrate including a plurality of partially-cured electrically conductive polymer bumps;
   a die including a plurality of contact pads, and partially-cured electrically non-conductive film surrounding each contact pad such as to expose the contact pads; and
   the bumps and non-conductive film forming a covalently bonded laminate structure.

9. The integrated circuit device of claim 8, wherein the bumps and the film being formed from materials allowing control of the degree of latency of the bumps and the film.

10. The integrated circuit device of claim 9, wherein the materials include benzocyclobutene.

11. An integrated circuit device, comprising:
    a die including a contact pad surrounded by a collar, the collar being initially formed from partially-cured, non-electrically conductive materials, and a bump being formed that extends out of the collar;
    a substrate including a plurality of contact pads, and a film, initially formed from partially-cured electrically non-conductive materials, surrounding each contact pad such as to expose the contact pads; and
    the collar and non-conductive film forming a covalently bonded laminate structure.

12. The integrated circuit device of claim 11, wherein the collar and the film being formed from materials allowing control of the degree of latency of the collar and the film.

13. The integrated circuit device of claim 11, wherein the bump being formed from one of benzocyclobutene, electroplated solder, stencil printed solder, and electrically conductive paste.

14. An integrated circuit device, comprising:
    a die including a contact pad and a bump, initially formed from partially-cured electrically conductive or partially-cured non-conductive polymer materials, separated from the contact pad;
    a substrate including a plurality of contact pads, and a film, initially formed from partially-cured electrically non-conductive materials, surrounding each contact pad such as to expose the contact pads; and
    the bumps and non-conductive film forming a covalently bonded laminate structure.

15. The integrated circuit device of claim 14, wherein the bump and the film being formed from materials allowing control of the degree of latency of the bump and the film.

16. An integrated circuit device, comprising:
    a die including a plurality of bumps initially formed, each using a single layer, from partially-cured electrically conductive polymer materials;

a substrate including a plurality of contact pads, and a film, initially formed from partially-cured electrically non-conductive materials, surrounding each contact pad such as to expose the contact pads; and the bumps and non-conductive film forming a covalently bonded laminate structure.

17. The integrated circuit device of claim 16, wherein the materials include benzocyclobutene.

18. An integrated circuit device, comprising:

a die including a plurality of bumps and a layer surrounding each bump wherein the bumps and the layer being initially formed from partially-cured electrically conductive polymer materials;

a substrate including a plurality of contact pads, and a film, initially formed from partially-cured electrically non-conductive materials, surrounding each contact pad such as to expose the contact pads; and the bumps, layer, and non-conductive film forming a covalently bonded laminate structure.

19. The integrated circuit device of claim 18, wherein the materials include benzocyclobutene.

* * * * *